US012676206B2

(12) United States Patent
Seo et al.

(10) Patent No.: US 12,676,206 B2
(45) Date of Patent: Jul. 7, 2026

(54) MEMORY DEVICE FOR CONTROLLING A DATA OUTPUT ORDER AND AN OPERATING METHOD THEREOF

(71) Applicant: SAMSUNG ELECTRONICS CO., LTD., Suwon-si (KR)

(72) Inventors: Jiwon Seo, Suwon-si (KR); Keeho Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 97 days.

(21) Appl. No.: 18/420,867

(22) Filed: Jan. 24, 2024

(65) Prior Publication Data

US 2024/0321381 A1      Sep. 26, 2024

(30) Foreign Application Priority Data

Mar. 24, 2023    (KR) ......................... 10-2023-0039194
May 15, 2023    (KR) ......................... 10-2023-0062698

(51) Int. Cl.
*G11C 29/52*        (2006.01)
*G11C 7/10*         (2006.01)
*G11C 7/22*         (2006.01)

(52) U.S. Cl.
CPC .............. *G11C 29/52* (2013.01); *G11C 7/106* (2013.01); *G11C 7/1069* (2013.01); *G11C 7/222* (2013.01)

(58) Field of Classification Search
CPC ....... G11C 29/52; G11C 7/106; G11C 7/1069; G11C 7/222
USPC ......................................................... 365/185
See application file for complete search history.

(56) References Cited

U.S. PATENT DOCUMENTS

| | | | |
|---|---|---|---|
| 9,293,210 B2 | 3/2016 | Jang et al. | |
| 10,373,691 B2 * | 8/2019 | Jung ...................... | G11C 16/04 |
| 2011/0280070 A1 | 11/2011 | Kim et al. | |
| 2012/0166913 A1 | 6/2012 | Alrod et al. | |
| 2015/0303948 A1 * | 10/2015 | Yoon ................... | G11C 11/5642 |
| | | | 714/764 |
| 2018/0081542 A1 | 3/2018 | Shirakawa et al. | |
| 2019/0130982 A1 | 5/2019 | Reusswig et al. | |

(Continued)

FOREIGN PATENT DOCUMENTS

| | | |
|---|---|---|
| CN | 115527594 A | 12/2022 |
| KR | 10-2011-0124632 | 11/2011 |

(Continued)

*Primary Examiner* — Amir Zarabian
*Assistant Examiner* — Minh Dinh
(74) *Attorney, Agent, or Firm* — Morgan, Lewis & Bockius LLP

(57)        ABSTRACT

A memory device including: a memory cell array including pages each page including memory cells; a page buffer circuit including page buffers corresponding to the memory cells of each page, each of the page buffers including first through N-th latches; and a control logic to control first hard decision data and first soft decision data read in a first read operation on a first page to remain in a first page buffer during a second read operation on a second page, and control an output operation such that the first hard decision data is output after the first soft decision data is output when the memory device is set to a first output mode, wherein the first hard decision data is based on a normal read level and the first soft decision data is based on an offset read level read from the first page.

18 Claims, 16 Drawing Sheets

<u>10</u>

(56) References Cited

U.S. PATENT DOCUMENTS

2020/0319965 A1    10/2020  El Gamal et al.
2023/0170004 A1*   6/2023  Azuma  .............. G06F 12/0246
                                            365/189.011

FOREIGN PATENT DOCUMENTS

KR      10-2019-0036285     4/2019
KR          10-2125371     6/2020

* cited by examiner

| HD | 1 | | 0 | |
|----|-----|-----|-----|-----|
| SD | 0 | 1 | 0 | |

MEMORY DEVICE FOR CONTROLLING A DATA OUTPUT ORDER AND AN OPERATING METHOD THEREOF

CROSS-REFERENCE TO RELATED APPLICATIONS

This application claims priority under 35 U.S.C. § 119 to Korean Patent Application Nos. 10-2023-0039194, filed on Mar. 24, 2023, and 10-2023-0062698, filed on May 15, 2023, in the Korean Intellectual Property Office, the disclosures of which are incorporated by reference herein in their entireties.

TECHNICAL FIELD

The inventive concept relates to a memory device, and more particularly, to a memory device for controlling a data output order and an operating method thereof.

DISCUSSION OF RELATED ART

A non-volatile memory device, serving as a memory device, includes a plurality of memory cells that store data non-volatilely. A flash memory device is one such example of a non-volatile memory device. The flash memory device may be used in a variety of equipment such as mobile phones, digital cameras, personal digital assistants (PDAs), mobile computing devices, stationary computing devices, and other various types of devices.

A memory device can perform read or write operations on data using various methods. As an example, in response to a read request, the memory device may generate and output both hard decision data and soft decision data. The hard decision data may be data read by using a normal read level with a certain voltage level, and the soft decision data may be data read by using an offset read level with a certain offset from the normal read level.

A memory controller may read data by using the hard decision data and the soft decision data received from the memory device. However, issues may arise if the memory device does not adapt its output data to various operating environments that may be implemented in the memory controller, potentially leading to inaccurate data readings by the memory controller.

SUMMARY

Embodiments of the inventive concept provide a memory device optimized to an operating environment of a memory controller and capable of adjusting a data output order, as well as an operating method thereof.

According to an embodiment of the inventive concept, there is provided a memory device including: a memory cell array including a plurality of pages each page including a plurality of memory cells; a page buffer circuit including page buffers respectively corresponding to the plurality of memory cells of each page, each of the page buffers including first through N-th latches (where N is an integer greater than or equal to 2); and a control logic configured to control first hard decision data and first soft decision data read in a first read operation on a first page among the plurality of pages to remain in a first page buffer of the page buffers during a second read operation on a second page among the plurality of pages, and control an output operation such that the first hard decision data is output after the first soft decision data is output when the memory device is set to a first output mode, wherein the first hard decision data is based on a normal read level and the first soft decision data is based on an offset read level read from the first page.

According to an embodiment of the inventive concept, there is provided an operating method of a memory device including a memory cell array including a plurality of pages and a page buffer circuit including a plurality of page buffers, the operating method including: reading first hard decision data and first soft decision data by performing a first read operation on a first page of the plurality of pages in response to a first command received from a memory controller; storing the first hard decision data in a first latch in a page buffer of the plurality of page buffers; storing the first soft decision data in a second latch and a third latch in the page buffer; dumping the first hard decision data to a fourth latch in the page buffer; dumping the first soft decision data to a fifth latch in the page buffer; and reading second hard decision data and second soft decision data by performing a second read operation on a second page in response to a second command from the memory controller, wherein the first hard decision data remains in the fourth latch while the second read operation is performed.

According to an embodiment of the inventive concept, there is provided an operating method of a memory device including a memory cell array including a plurality of pages and a page buffer circuit including a plurality of page buffers, the operating method including: setting an output mode to a first mode in response to a first command; storing first hard decision data and first soft decision data read from a first page of the plurality of pages in latches in a page buffer of the plurality of page buffers; dumping the first hard decision data to a cache latch in the page buffer and outputting the dumped first hard decision data; dumping the first soft decision data to the cache latch and outputting the dumped first soft decision data after outputting the dumped first hard decision data; setting the output mode to a second mode in response to a second command; storing second hard decision data and second soft decision data read from a second page in the latches in the page buffer; dumping the second soft decision data to the cache latch and outputting the dumped second soft decision data; and dumping the second hard decision data to the cache latch and outputting the dumped second hard decision data after outputting the dumped second soft decision data.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
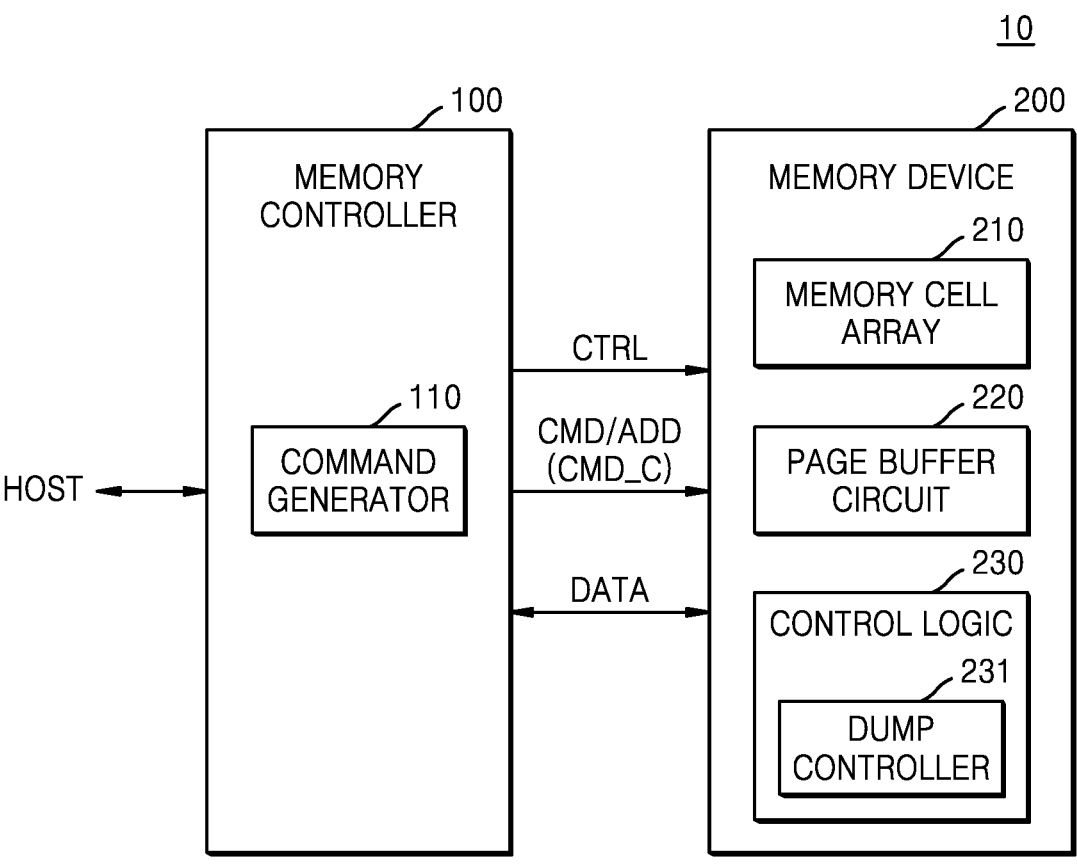
FIG. 1 is a block diagram illustrating a memory system according to an embodiment.

FIG. 1 is a block diagram illustrating a memory system according to an embodiment.

Referring to FIG. 1, a memory system 10 may include a memory controller 100 and a memory device 200. The memory device 200 may include a memory cell array 210, a page buffer circuit 220, and a control logic 230. The control logic 230 may be implemented in hardware as a circuit. The control logic 230 may include a dump controller 231. In the example of FIG. 1, the dump controller 231 is illustrated as being included in the control logic 230, but the dump controller 231 according to an embodiment may be implemented as a separate component outside the control logic 230. For example, the dump controller 231 may be implemented as a circuit separate from the control logic 230.

The memory system 10 may communicate with a host HOST through various interfaces. As an example, the memory system 10 may communicate with the host HOST through various interfaces such as Universal Serial Bus (USB), multimedia card (MMC), embedded MMC (eMMC), peripheral component interconnection (PCI), PCI-express (PCI-E), Advanced Technology Attachment (ATA), Serial-ATA, Parallel-ATA, small computer small interface (SCSI), enhanced small disk interface (ESDI), Integrated Drive Electronics (IDE), Firewire, Universal Flash Storage (UFS), Non-volatile Memory express (NVMe), etc.

According to an embodiment, the memory device 200 may include a non-volatile memory device such as flash memory. In some embodiments, the memory system 10 may be implemented as memory embedded in or removable from an electronic device. For example, the memory system 10 may be implemented in various types such as an embedded UFS memory device, an eMMC, a Solid State Drive (SSD), a UFS memory card, Compact Flash (CF), Secure Digital (SD), Micro Secure Digital (Micro-SD), Mini Secure Digital (Mini-SD), extreme Digital (xD), or a memory stick. Additionally, the memory system 10 that non-volatilely stores data may be referred to as a storage device.

The memory controller 100 may control the memory device 200 to read data stored in the memory device 200 or write (or program) data to the memory device 200 in response to a write/read request from the host HOST. As an example, the memory controller 100 may control program, read, and erase operations of the memory device 200 by providing an address ADD, a command CMD, and a control signal CTRL to the memory device 200. Additionally, data DATA to be stored in the memory device 200 and data DATA read from the memory device 200 may be transmitted and received between the memory controller 100 and the memory device 200. As an example, the memory controller 100 may include a processor. The processor may control overall internal operations of the memory controller 100 and also control memory operations of the memory device 200.

The memory cell array 210 may include a plurality of memory cells. For example, the plurality of memory cells may be flash memory cells. Hereinafter, some embodiments are described in detail by way of an example in which the plurality of memory cells are NAND flash memory cells. However, the inventive concept is not limited thereto, and in some embodiments, the plurality of memory cells may be resistive memory cells such as resistive random access memory (RAM) (ReRAM), phase change RAM (PRAM), or magnetic RAM (MRAM).

In an embodiment, the memory cell array 210 may include a three-dimensional (3D) memory cell array. The 3D memory cell array may include a plurality of NAND strings each including memory cells respectively connected to word lines vertically stacked on a substrate. However, the inventive concept is not limited thereto, and in some embodiments, the memory cell array 210 may include a two-dimensional (2D) memory cell array. The 2D memory cell array may include a plurality of NAND flash memory arrays arranged in row and column directions.

As a read command is provided to the memory device 200 from the memory controller 100, a read operation may be performed based on the control of the control logic 230. As an example, when each memory cell of the memory cell array 210 stores a plurality of bits, the memory cells may include a plurality of threshold voltage distributions, and data including two or more bits may be read from each memory cell.

The page buffer circuit 220 may store data of a certain page unit read from the memory device 200 and may include a page buffer arranged to correspond to each bit line. In other words, each bit line may be connected to a single page buffer of the page buffer circuit 220. Each page buffer may include one or more latches. As an example, one latch (e.g., a cache latch) may store data to be output to the memory controller 100, and another latch (e.g., a sensing latch) may be connected to a bit line and used for sensing data.

In addition, in determining the data stored in the memory cells, a read operation using one or more read levels may be performed. According to an embodiment, hard decision data and soft decision data with respect to each memory cell may be read. The hard decision data may correspond to data that is read with respect to a normal read level in a normal read operation, and the soft decision data may correspond to data that is read with respect to an offset read level having a certain offset with respect to the normal read level. In other words, the hard decision data may correspond to data read at the normal level. Conversely, the soft decision data may correspond to data read at an offset level, which has a specific offset compared to the normal read level. In an embodiment, the offset read level may include a read level having a positive (+) offset and a read level having a negative (−) offset with respect to the normal read level. In an embodiment, the hard decision data may be referred to as hard decision information, and the soft decision data may be referred to as soft decision information.

The control logic 230 may control the overall operations of the memory device 200. For example, the control logic 230 may output various internal control signals for programming data to the memory cell array 210 or reading data from the memory cell array 210 based on the command CMD, the address ADD, and the control signal CTRL received from the memory controller 100. Further, according to an embodiment, the control logic 230 may perform a control operation such that the hard decision data and the soft decision data are stored in respective page buffers in the page buffer circuit 220. In addition, the control logic 230 may control a dump operation such that the hard decision data and the soft decision data are dumped between a plurality of latches in the page buffer. In other words, the control logic 230 can manage a dump operation, facilitating the transfer of the hard decision data and the soft decision data to the latches of the page buffer.

According to an embodiment, the memory device 200 may provide data read through the normal read operation to the memory controller 100 in response to the read command, and when an error occurs in the read data, the memory device 200 may read the hard decision data and the soft decision data and provide the read hard decision data and soft decision data to the memory controller 100 again. The memory controller 100 may perform an error correction operation such as a low density parity check (LDPC) by using the received hard decision data and soft decision data.

Alternatively, the memory device 200 may provide the hard decision data and the soft decision data as a normal response when the read command is received from the memory controller 100 regardless of an error detection result. In some embodiments described below, the hard decision data and the soft decision data provided by the memory device 200 may be applied to various cases as described above.

A detailed operation example of the interaction between the memory controller 100 and the memory device 200 in an embodiment is described below.

The memory controller 100 may include a command generator 110. The command generator 110 may generate various other types of commands along with the read command. The command generator 110 may provide the read command to the memory device 200 and receive the hard decision data and the soft decision data from the memory device 200. In some embodiments, a command combination CMD_C, consisting of multiple commands, may be defined to sequentially receive the hard decision data and the soft decision data. As an example, the memory controller 100 may sequentially provide a plurality of commands at certain timings to control reading, dumping, and outputting of data. In some embodiments, the read command may correspond to the command combination CMD_C including the plurality of commands described above.

In an embodiment, the memory device 200 may first output the hard decision data and then output the soft decision data. Alternatively, the memory device 200 may first output the soft decision data and then output the hard decision data. For example, the memory device 200 may control an output order of the hard decision data and the soft decision data according to an internal setting operation, a setting operation controlled by the memory controller 100, or a type of command from the memory controller 100.

As an example, when the memory controller 100 is connected to the memory device 200, the memory device 200 may receive control information related to an output mode from the memory controller 100, determine a data reading method determined by the memory controller 100 based on the control information, and set an operating environment related to the data output order according to the control information. Additionally, as another example, a plurality of types of read commands may be provided in relation to a data output scheme, and when one type of read command is received, the memory device 200 may first output the hard decision data, and, when another type of read command is received, the memory device 200 may first the output soft decision data.

When one memory cell stores data of a plurality of bits, a plurality of latches may be provided in each page buffer. As an example, at least five latches (hereinafter referred to as first to fifth latches) may be provided in each page buffer in correspondence to a triple level cell (TLC). The hard decision data and the soft decision data may be generated from each memory cell, and may be temporarily stored in at least some of the first to fifth latches. In addition, the dump operation of changing or copying storage locations in the first to fifth latches may be performed on each of the hard decision data and the soft decision data. In other words, the dump operation can be executed on both hard decision data and soft decision data.

In an embodiment, successive commands (e.g., first to third commands) may be sent from the memory controller 100 to sequentially output the hard decision data and the soft decision data. As an example, during a read operation corresponding to a second command, which requests the reading of a second page, at least one of first hard decision data and first soft decision data read in response to a first command requesting the reading of a first page may remain in the page buffer. As an example, the hard decision data or the soft decision data of a certain size (e.g., a page size of 8K, 16K, etc.) read in units of one page may be compressed and output from the memory device 200. As an example, it is to be understood that a compression unit in the memory device 200 compresses the soft decision data.

When the hard decision data is first output, the first hard decision data may be output to the memory controller 100 after the first command is received but before the second command is received. Additionally, a compression operation on the first soft decision data may be performed in parallel with the read operation corresponding to the second command, and the compressed first soft decision data may be output to the memory controller 100 before a third command is received. Accordingly, the first soft decision data may remain in at least one of a plurality of latches in the page buffer while the read operation corresponding to the second command is performed. As another example, second hard decision data read from the second page may be output in response to the third command, and second soft decision data may be output in response to a command subsequent thereto. For example, the second soft decision data may be output in response to a fourth command.

On the other hand, when the soft decision data is first output, the first soft decision data may be output after the second command is received. As an example, in the same manner as when the hard decision data is first output, the compression operation on the first soft decision data may be performed in parallel with the read operation corresponding to the second command. In this case, the first soft decision data may be output to the memory controller 100 before the third command is received. Additionally, the first hard decision data may be output to the memory controller 100 in response to receiving the third command after the first soft decision data is output. Accordingly, the first hard decision data may remain in at least one of a plurality of latches in the page buffer while the read operation corresponding to the second command is performed.

Additionally, according to some embodiments, the hard decision data and the soft decision data may be generated together in the same read operation. As an example, the hard decision data and the soft decision data may have different read levels, and hard decision data corresponding to the normal read level and soft decision data corresponding to the offset read level may be generated by using different sensing timings in one sensing period. As an example, when the sensing timing is relatively early, a data value may be read with respect to a relatively low threshold voltage level, and when the sensing timing is relatively late, the data value may be read with respect to a relatively high threshold voltage level.

According to some embodiments described above, the memory device 200 may change the output order of the hard decision data and the soft decision data according to an internal setting of the memory device 200 or a command received from the memory controller 100, and thus, additional resources may not be required to change the output order. For example, the memory controller 100 may read data or detect/correct errors in data by using various types of algorithms, and the memory device 200 may perform a data output operation optimized for interaction with the memory controller 100.

Furthermore, according to some embodiments, each of the memory controller 100 and the memory device 200 may control the output operation of the hard decision data and the soft decision data based on hardware, software, or a combination thereof, or each of the memory controller 100 and the memory device 200 may control the dump operation between a plurality of latches in the page buffer. For example, the memory controller 100 may include a processor and an operating memory. When the output of the hard decision data and the soft decision data is controlled according to a combination of a plurality of commands, the processor may control an output of the command combination CMD_C including the plurality of commands by executing instructions stored in the operating memory.

Figure 2A:
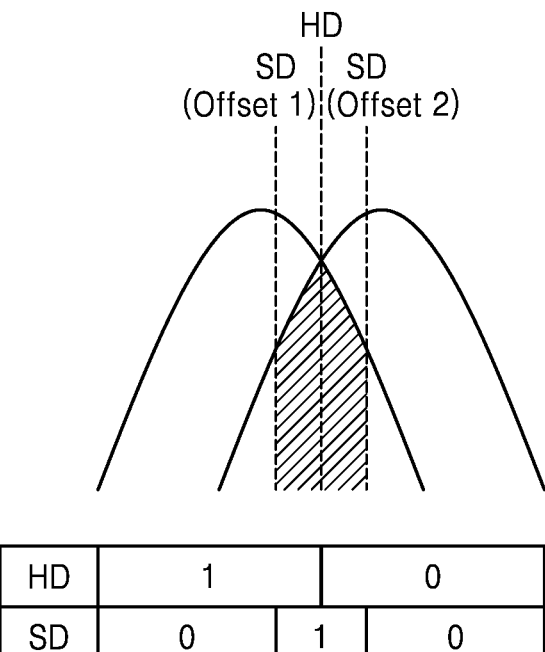
FIGS. 2A and 2B are diagrams illustrating examples of generating hard decision data and soft decision data.
Figure 2B:
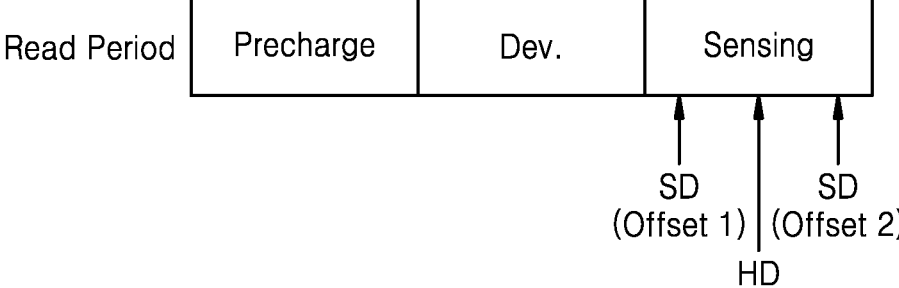

FIGS. 2A and 2B are diagrams illustrating examples of generating hard decision data and soft decision data.

Referring to FIGS. 1, 2A and 2B, the memory device 200 may output data read through a normal read level as hard decision data HD, and output data read through an offset read level as soft decision data SD. The offset read level may include a first offset read level Offset 1 having a level smaller than the normal read level by a first offset, and a second offset read level Offset 2 having a level greater than the normal read level by a second offset. The memory device 200 may generate the soft decision data SD based on values read by using the first offset read level Offset 1 and the second offset read level Offset 2. Additionally, the first offset and the second offset may be the same or different.

As an example, the hard decision data HD of a memory cell having a lower threshold voltage than the normal read level may have a value of "1", and the hard decision data HD of the memory cell having a higher threshold voltage than the normal read level may have a value of "0". In addition, the soft decision data SD of a memory cell having a threshold voltage lower than the first offset read level Offset 1 or higher than the second offset read level Offset 2 may have a value of "0", and the soft decision data SD of a memory cell having a threshold voltage between the first offset read level Offset 1 and the second offset read level Offset 2 may have a value of "1". In detecting/correcting errors of data, various parameters, such as a coefficient used in an error correction operation, may be calculated based on the hard decision data HD and the soft decision data SD generated as described above.

FIG. 2B shows an example of generating the hard decision data HD and the soft decision data SD through the same sensing operation.

A read operation may include a plurality of periods, and as an example, may include a pre-charge period, a develop period, and a sensing period. In the pre-charge period, a bit line may rise to a pre-charge voltage of a certain level. In the develop period, a bit line voltage level may vary according to data stored in a memory cell. As an example, when the memory cell is programmed with a relatively low threshold voltage corresponding to an on cell, the memory cell may have a characteristic in which the bit line voltage level rapidly increases, and when the memory cell is programmed with a relatively high threshold voltage corresponding to an off cell, the memory cell may have a characteristic in which the bit line voltage level gently falls.

In the sensing period, a sensing operation may be performed at least two different time to read the hard decision data HD and the soft decision data SD. As an example, the earlier the sensing timing occurs, the data value may be determined with respect to a relatively lower read level. Conversely, the later the sensing timing occurs, the data value may be determined with respect to a relatively higher read level. According to the sensing timing performed in the sensing period described above, data values with respect to the first offset read level Offset 1, the normal read level, and the second offset read level Offset 2 in the above-described embodiment may be read, and the hard decision data HD and the soft decision data SD may be generated through the above-described sensing operations.

Furthermore, in the embodiment shown in FIGS. 2A and B, since the soft decision data SD is generated based on two offset read levels (Offset 1 and Offset 2), the hard decision data HD and the soft decision data SD are generated by three sensing operations, but the embodiment is not necessarily limited thereto. As an example, the soft decision data SD may be generated based on a value sensed at one offset read level. Alternatively, the soft decision data SD may be generated by calculating a value sensed at the normal read level and a value sensed at the one offset read level.

Alternatively, in some embodiments, the memory device 200 may provide values sensed using two offset read levels to the memory controller 100. For example, the memory controller 100 may calculate a value corresponding to the hard decision data HD based on values sensed using two offset read levels, and may also calculate a value corresponding to the soft decision data SD. In some embodiments, data sequentially provided by the memory device may be referred to as the hard decision data HD and the soft decision data SD. In this regard, a value sensed using any one offset read level may be referred to as the hard decision data HD, and a value sensed using another offset read level may be referred to as the soft decision data SD.

Figure 3:
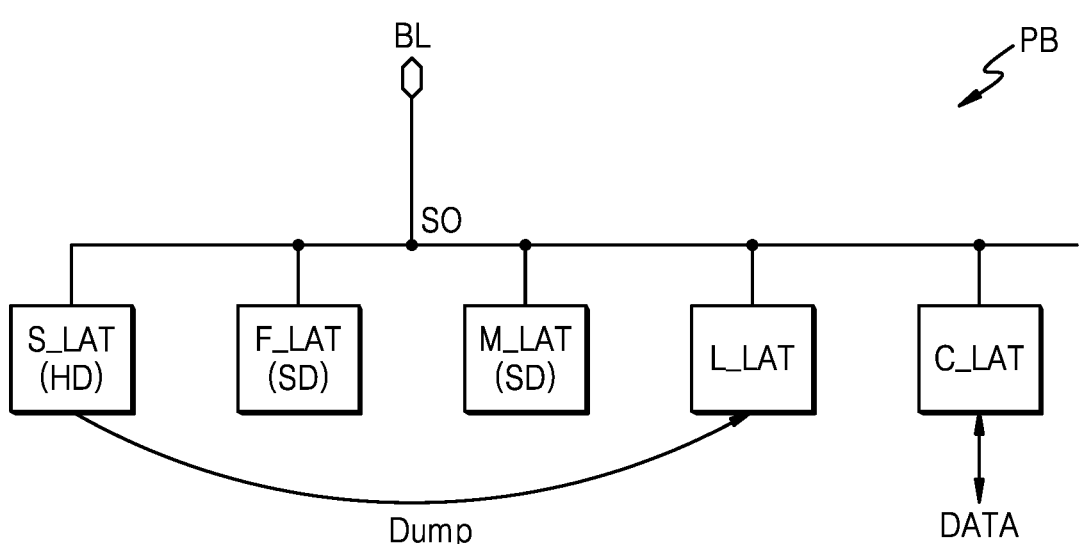
FIG. 3 is a diagram illustrating a page buffer according to an embodiment.

FIG. 3 is a diagram illustrating a page buffer according to an embodiment. In FIG. 3, a schematic configuration of a page buffer PB connected to any one bit line BL is illustrated, and a detailed illustration of various transistors that may be included in the page buffer PB is omitted. Additionally, a page buffer circuit (e.g., the page buffer circuit 220 of FIG. 1) may include a plurality of page buffers PB corresponding to a plurality of bit lines BL as shown in FIG. 3. In an embodiment, it is assumed that each page buffer PB includes first to fifth latches.

Referring to FIG. 3, the page buffer PB may be connected to the bit line BL through a sensing node SO, and may include the fifth latch (e.g., a cache latch C_LAT). The cache latch C_LAT may store data DATA received from the outside or output data to the outside. Additionally, data DATA may be dumped between the cache latch C_LAT and other latches of the page buffer PB.

The page buffer PB may further include the first latch (e.g., a sensing latch S_LAT), the second latch (e.g., a force latch F_LAT), the third latch (e.g., a first data latch M_LAT), and the fourth latch (e.g., a second data latch L_LAT). The read hard decision data HD and soft decision data SD may be stored in at least some of the first to fifth latches. In an embodiment, the sensing latch S_LAT may be used to sense the hard decision data HD, and the force latch F_LAT may be used to sense the soft decision data SD.

In an embodiment, since the hard decision data HD and the soft decision data SD are generated together in one sensing period, the hard decision data HD may be stored in the sensing latch S_LAT, and the soft decision data SD may be stored in the force latch F_LAT. Additionally, the soft decision data SD may be generated based on information corresponding to at least two offset read levels, and thus, the first data latch M_LAT may be further used to store the soft decision data SD. For example, the soft decision data SD having values according to sensing results corresponding to first and second offset read levels in the force latch F_LAT may be stored in the first data latch M_LAT. In other words, the soft decision data SD may be stored just in the first data latch M_LAT. Alternatively, in another embodiment, the sensing results corresponding to the first and second offset read levels may be stored in the force latch F_LAT and the first data latch M_LAT.

According to an embodiment, when the hard decision data HD is output later than the soft decision data SD, the hard decision data HD may need to remain in the page buffer PB during a read operation corresponding to a next read command. In an embodiment, the hard decision data HD stored in the sensing latch S_LAT may be dumped to another latch in the page buffer PB. In this case, for example, the hard decision data HD may be dumped to the second data latch L_LAT. In other words, the hard decision data HD stored in the sensing latch S_LAT may be moved to the second data latch L_LAT before a read operation in response to the next read command is performed.

According to the embodiment as described above, the hard decision data HD and the soft decision data SD may remain in the page buffer PB during the next read operation. In addition, the first to third latches may be used for sensing in the next read operation, and any one of the hard decision data HD and the soft decision data SD generated in a previous read operation may remain in the second data latch L_LAT and the other one of the hard decision data HD and the soft decision data SD generated in the previous read operation may remain in the cache latch C_LAT.

Further, according to an embodiment, a dump operation between the first to fifth latches may be controlled with respect to each of the hard decision data HD and the soft decision data SD depending on a data output order. As an example, assuming that a compression operation on the soft decision data SD is performed in parallel with the read operation in response to the next read command, in a mode where the hard decision data HD is output first, the dump operation may be controlled such that the hard decision data HD is output first before the next read command is received while the soft decision data SD remains in the page buffer PB after the next read command is received. On the other hand, in a mode where the soft decision data SD is output first, the dump operation may be controlled such that the hard decision data HD and the soft decision data SD remain in the page buffer PB after the next read command is received.

Figure 4:
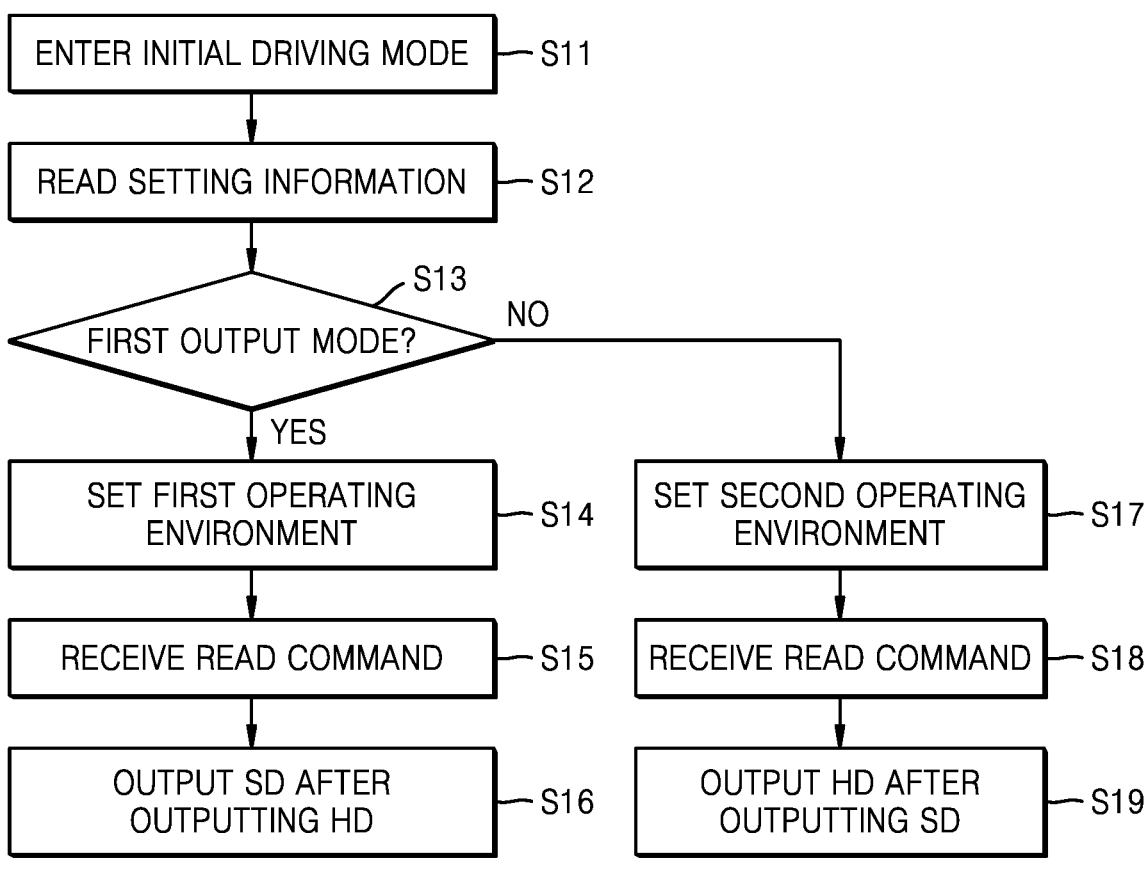
FIGS. 4 and 5 are flowcharts illustrating operations of a memory system according to some embodiments.
Figure 5:
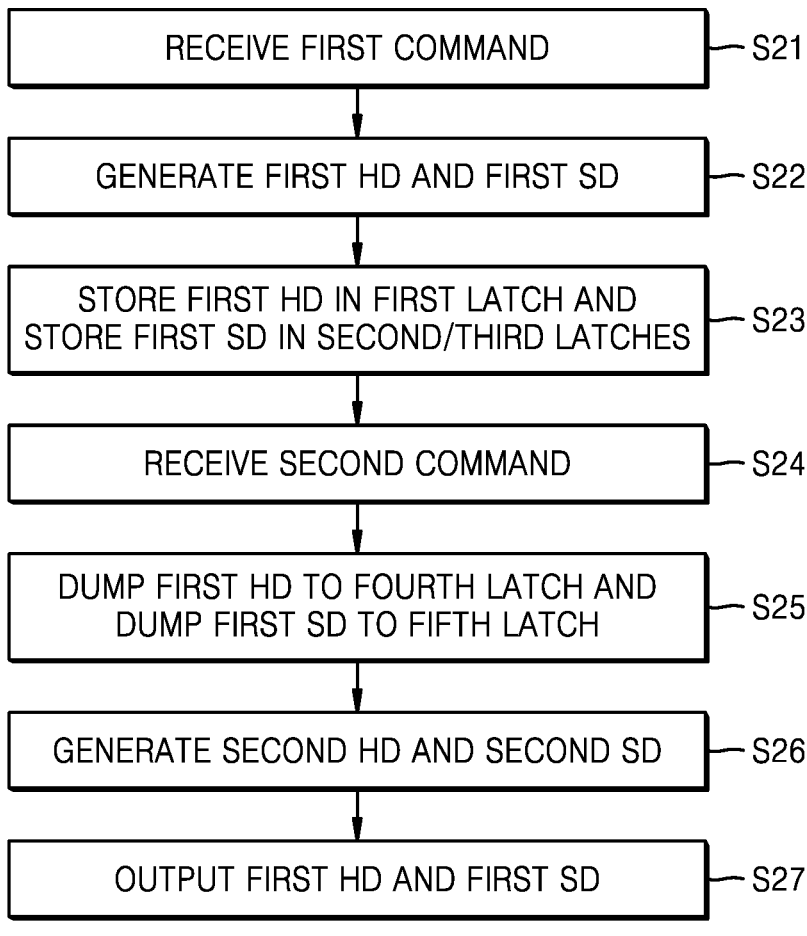

FIGS. 4 and 5 are flowcharts illustrating operations of a memory system according to some embodiments. Each operation illustrated in FIGS. 4 and 5 may be an operation of a memory controller or an operation of a memory device.

Referring to FIG. 4, the memory device may store setting information applicable to different types of memory controllers during a manufacturing process. As an example, the memory device may store setting information of a first value in response to a memory controller employing a data discrimination method in which hard decision data is received first, and may store setting information of a second value in response to a memory controller employing a data determination method in which soft decision data is received first. The memory device may be connected to the memory controller, and as power is provided to the memory device, the memory device may enter an initial driving mode (S11).

The memory device may read the setting information stored therein (S12), and determine whether the memory device operates in a first output mode (e.g., a mode where the hard decision data is output first) according to a result of reading the setting information (S13). When it is determined that setting information corresponds to the first output mode, the memory device may be set to a first operating environment in relation to an output order of data in the initial driving mode (S14), and then may receive a read command from the memory controller during a memory operation (S15). The memory device may generate the hard decision data and the soft decision data in response to the read command, may first output the hard decision data to the memory controller based on control of a dump operation according to the above-described embodiments, and then, may output the soft decision data to the memory controller (S16).

On the other hand, when it is determined that the setting information corresponds to a second output mode (e.g., a mode where the soft decision data is output first), the memory device may be set to a second operating environment in relation to the output order of data in the initial drive mode (S17), and then may receive the read command from the memory controller during the memory operation (S18). The memory device may first output the soft decision data to the memory controller in response to the read command and then output the hard decision data to the memory controller (S19).

In FIG. 5, a specific example of a dump operation when the soft decision data is output first is described. As an example, the memory device may receive a first command (S21) and generate first hard decision data and first soft decision data in response to the first command (S22). Additionally, the generated first hard decision data may be stored in a first latch in a page buffer, and the first soft decision data may be stored in second and third latches in the page buffer (S23).

The first to third latches described above may be used to sense the hard decision data and the soft decision data. Thereafter, the memory device may receive a second command (S24), the first hard decision data may be dumped to a fourth latch in the page buffer, and the first soft decision data may be dumped to a fifth latch in the page buffer (S25). In addition, the memory device may generate and store second hard decision data and second soft decision data through the first to third latches (S26), and may output the first hard decision data and the first soft decision data respectively stored in the fourth and fifth latches to the memory controller (S27). In an embodiment, the fifth latch corresponds to a cache latch, and thus, the first soft decision data stored in the fifth latch may be first output to the memory controller. Thereafter, the first hard decision data stored in the fourth latch may be dumped to the fifth latch, and may be output from the fifth latch to the memory controller.

Figure 6:
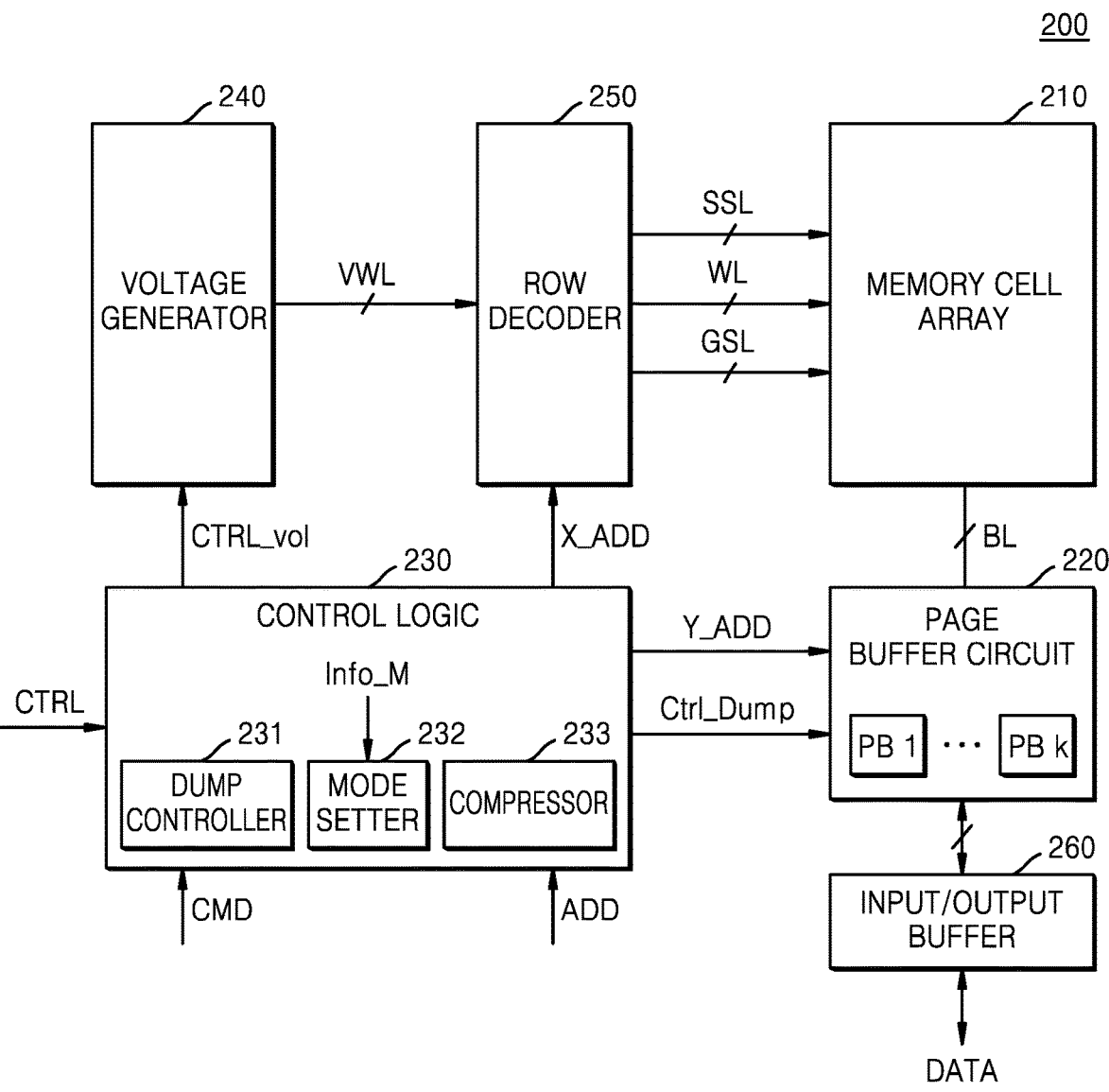
FIG. 6 is a block diagram illustrating an implementation example of the memory device of FIG. 1.

FIG. 6 is a block diagram illustrating an implementation example of the memory device 200 of FIG. 1.

Referring to FIGS. 1 and 6, the memory device 200 may include the memory cell array 210, the page buffer circuit 220, the control logic 230, a voltage generator 240, a row decoder 250, and an input/output buffer 260. Additionally, the control logic 230 may include a dump controller 231, a mode setter 232, and a compressor 233. The memory device 200 may further include other various circuit blocks related to a memory operation such as an input/output interface. In addition, in the embodiment shown in FIG. 6, setting information Info_M related to a data output order is stored in a non-volatile fashion in the memory device 200, and the mode setter 232 sets the data output order based on the setting information Info_M. The setting information Info_M may be implemented as a flag value, etc., and may have different values according to output modes. However, the embodiments are not limited thereto, and the data output order may be determined by decoding a command of the memory controller 100 as in the above-described embodiment.

The memory cell array 210 may include a plurality of memory cells. The plurality of memory cells may be connected to word lines WL, a string selection line SSL, a ground selection line GSL, and bit lines BL. For example, the memory cell array 210 may be connected to the row decoder 250 through the word lines WL, the string selection line SSL, and the ground selection line GSL, and may be connected to the page buffer circuit 220 through the bit lines BL.

The page buffer circuit 220 may be connected to the bit lines BL to temporarily store write data or read data. The page buffer circuit 120 may include a plurality of page buffers (e.g., first to k-th page buffers PB 1 to PB k) corresponding to the bit lines BL. The plurality of page buffers may be respectively connected to the bit lines BL corresponding thereto through a sensing node and each of the plurality of page buffers may include a plurality of latches.

The control logic 230 may program data to the memory cell array 210 or read data from the memory cell array 210 based on the command CMD, the address ADD, and the control signal CTRL received from the memory controller 100. Various internal control signals output from the control logic 230 may be provided to the page buffer circuit 220, the voltage generator 240, and the row decoder 250. For example, the control logic 230 may provide a voltage control signal CTRL_vol to the voltage generator 240. The voltage generator 240 may provide word line voltages VWL of various levels to the row decoder 250 in relation to program/read/erase operations. Additionally, the control logic 230 may provide a row address X_ADD to the row decoder 250 and may provide a column address Y_ADD to the page buffer circuit 220.

In an embodiment, the dump controller 231 may provide a dump control signal Ctrl_Dump to the page buffer circuit 220, and may control a dump operation of hard decision data and soft decision data in each page buffer. In addition, the dump controller 231 may control the timing at which the dump operation is performed, and in an embodiment, may control the dump operation such that at least one of the hard decision data and the soft decision data remain in the page buffer during a read operation performed in response to a next read command.

According to the embodiment as described above, in an initial driving process of the memory device 200, the mode setter 232 may perform a setting operation of setting the data output order, and the dump controller 231 may control the dump operation such that the hard decision data and the soft decision data are output according to the data output order set by the mode setter 232. Further, the compressor 233 may perform a compression operation on the hard decision data and/or the soft decision data. Additionally, in an embodiment, at least some of the dump controller 231, the mode setter 232, and the compressor 233 may be located outside the control logic 230, and may also be implemented through hardware, software, or a combination of thereof.

Hereinafter, specific data output examples according to some embodiments are described. In describing these embodiments, five latches are provided in the page buffer, but the embodiments are not limited thereto, and other numbers of latches may be provided in the page buffer.

Figure 7:
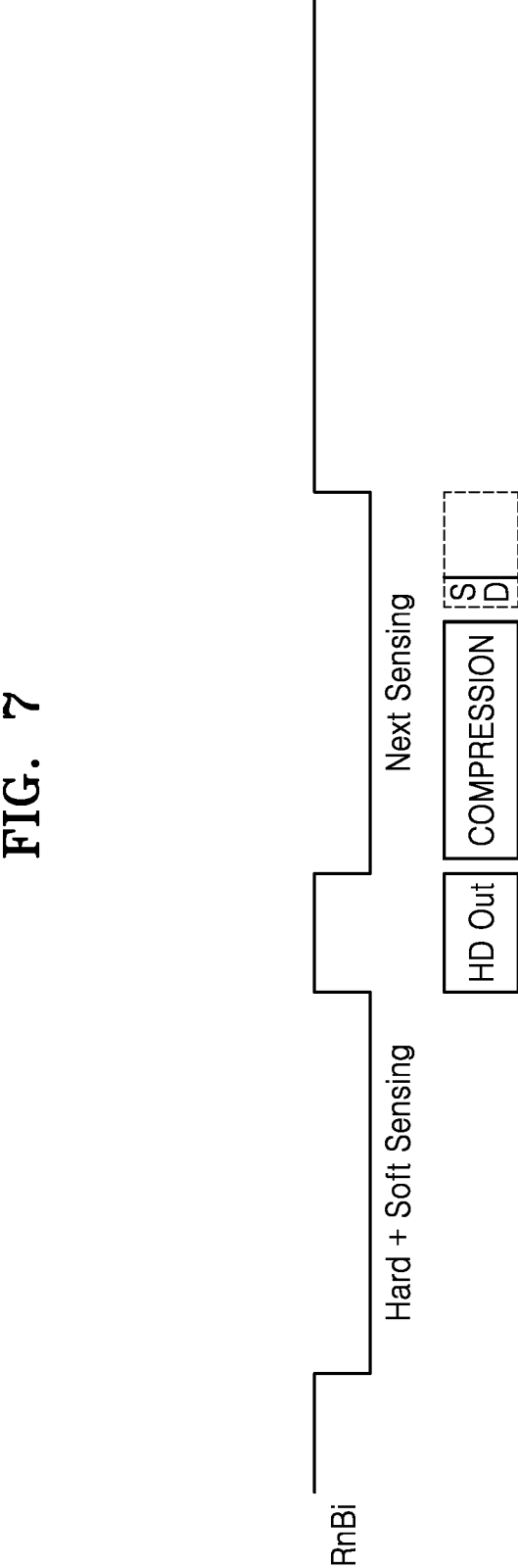
FIGS. 7 and 8 are diagrams illustrating examples of waveforms when hard decision data is output first.
Figure 8:
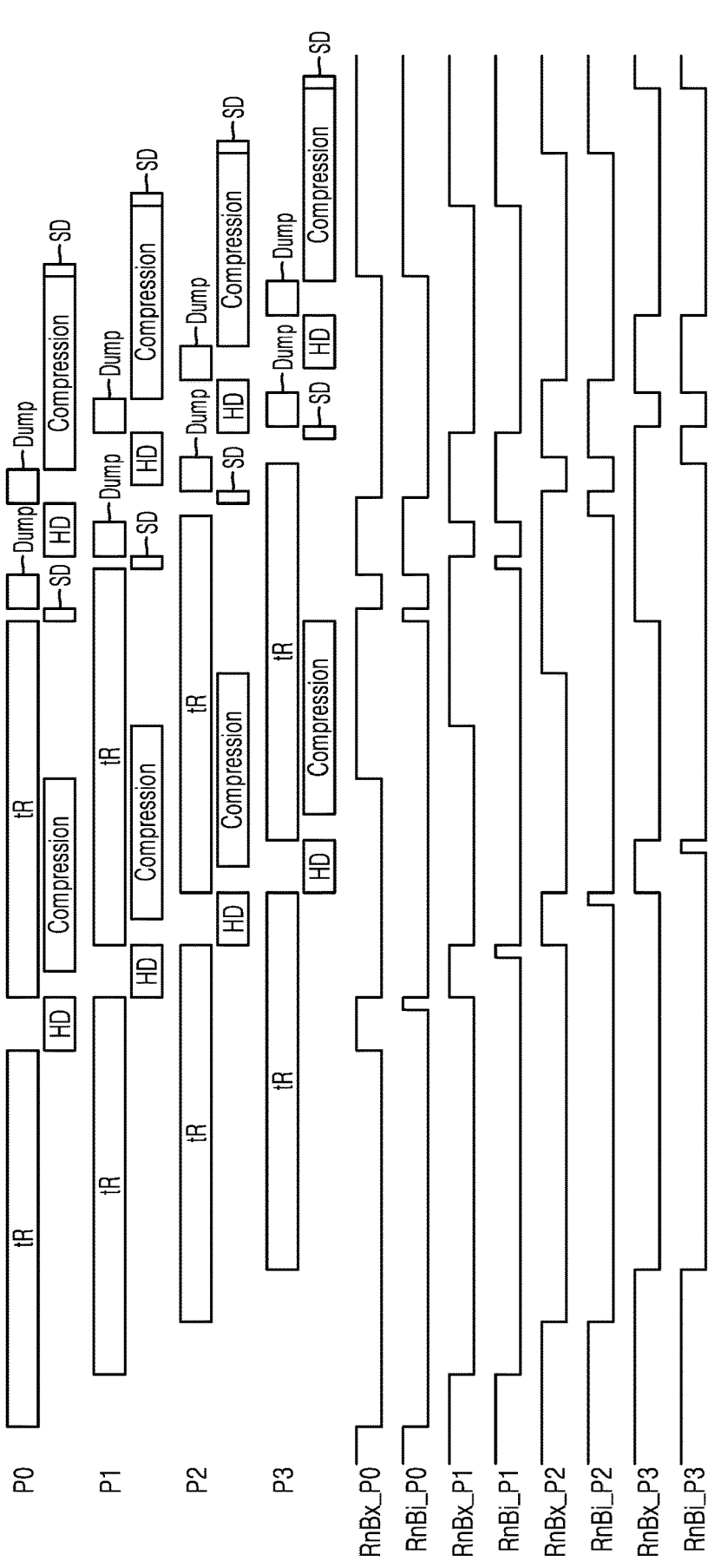

FIGS. 7 and 8 are diagrams illustrating examples of waveforms when the hard decision data HD is output first.

Referring to FIG. 7, a memory device may perform a read operation in response to a read command from a memory controller, and internal ready/busy signal RnBi may remain in a logic low state while the read operation is performed. In an embodiment, the memory device may include a plurality of planes (or various types of memory areas such as a die), and the read operation may be separately performed in units of plane.

According to some embodiments, the memory controller may serially output at least two predefined commands, and the memory device may output data in consideration of sensing, compression and order according to some embodiments according to a result of executing received commands. For example, the memory device may sense the first hard decision data HD and the first soft decision data SD from a first page according to a series of commands from the memory controller, and first provide the first hard decision data HD (HD Out) to the memory controller. Additionally, the memory device may perform a compression operation (COMPRESSION) on the first soft decision data SD while performing a sensing operation on a next second page, and provide the compressed first soft decision data SD to the memory controller. In the example shown in FIG. 7, compression is completed while the sensing operation on the second page is performed and the soft decision data SD is output to the memory controller before the sensing operation on the second page is completed.

FIG. 8 shows an example of an operation in a memory device including a plurality of planes. In FIG. 8, the hard decision data HD is output first, but the above-described embodiments may be applied to FIG. 8 when the soft decision data SD is output first.

Referring to FIG. 8, the memory device may include first to fourth planes P0, P1, P2 and P3 as the plurality of planes, and may perform read operations on the first to fourth planes P0 to P3 in parallel.

According to a command and an address from the memory controller, in a logic low state of first, second, third and fourth internal ready/busy signals RnBi_P0, RnBi_P1, RnBi_P2, and RnBi_P3, the first hard decision data HD and the first soft decision data SD may be generated from the first to fourth planes P0 to P3 during a certain read period tR. In addition, during a logic high period of first, second, third and fourth external ready/busy signals RnBx_PG, RnBx_P1, RnBx_P2, and RnBx_P3, the first hard decision data HD from the first to fourth planes P0 to P3 may be sequentially output to the memory controller at different time periods. In addition, during a logic high period of the first to fourth internal ready/busy signals RnBi_P0 to RnBi_P3, additional commands from the memory controller may be provided to the first to fourth planes P0 to P3. Furthermore, during a logic low period of the first to fourth internal ready/busy signals RnBi_P0 to RnBi_P3, a compression operation on the first soft decision data SD may be performed in parallel with the read operation performed on each of the first to fourth planes P0 to P3.

The compression operation may be performed for a time shorter than the certain read period tR, and the compressed first soft decision data SD may be output to the memory controller during the logic high period of the first to fourth external ready/busy signals RnBx_P0 to RnBx_P3. In addition, after the compressed first soft decision data SD is output, the first to fourth internal ready/busy signals RnBi_P0 to RnBi_P3 may remain in the logic low state, and a dump operation in which the second hard decision data HD is output to the memory controller may be performed. As another example, the second hard decision data HD may be dumped to a cache latch of a page buffer of each plane (P0 to P3) and output to the memory controller. Additionally, in response to a command from the memory controller, the second soft decision data SD may be dumped to the cache latch and compressed, and the compressed second soft decision data SD may be output to the memory controller.

Figure 9:
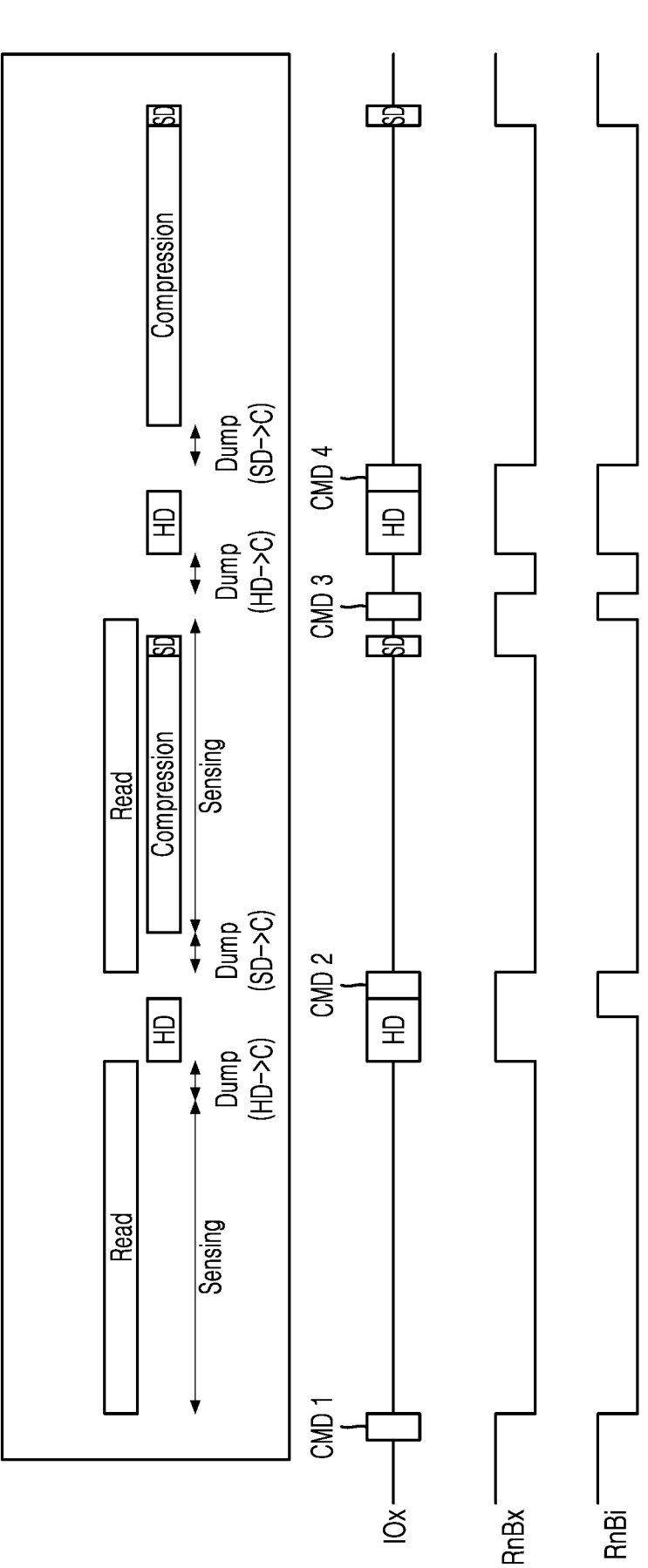
FIGS. 9, 10 and 11 are diagrams illustrating examples of a dump operation according to some embodiments.
Figure 10:
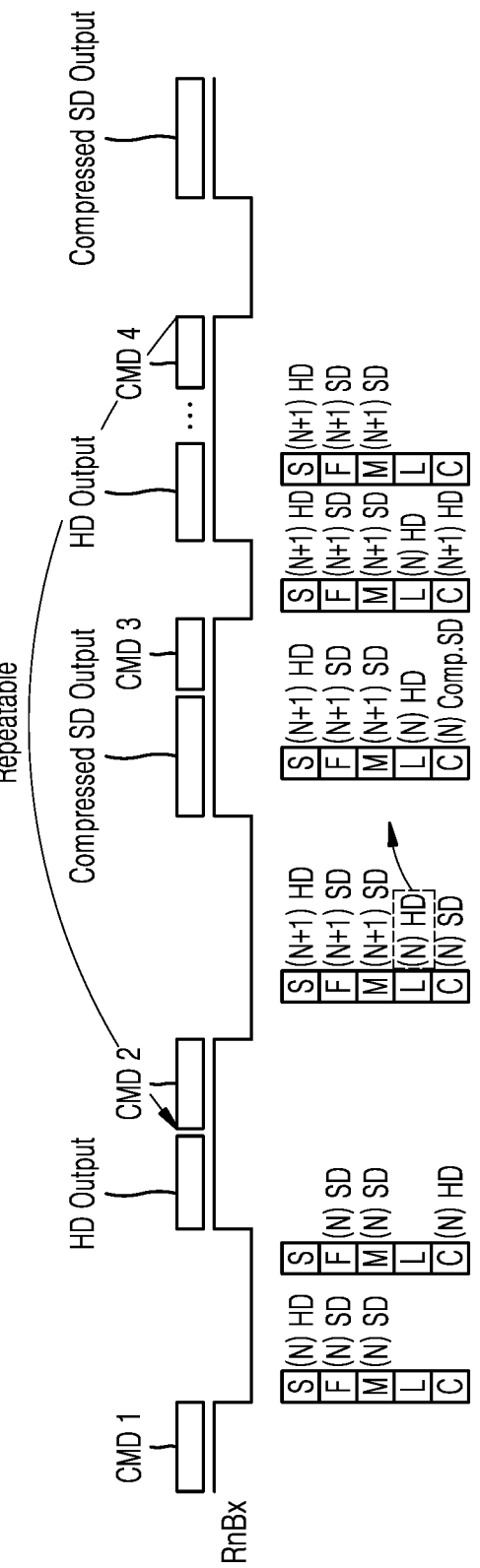
Figure 11:
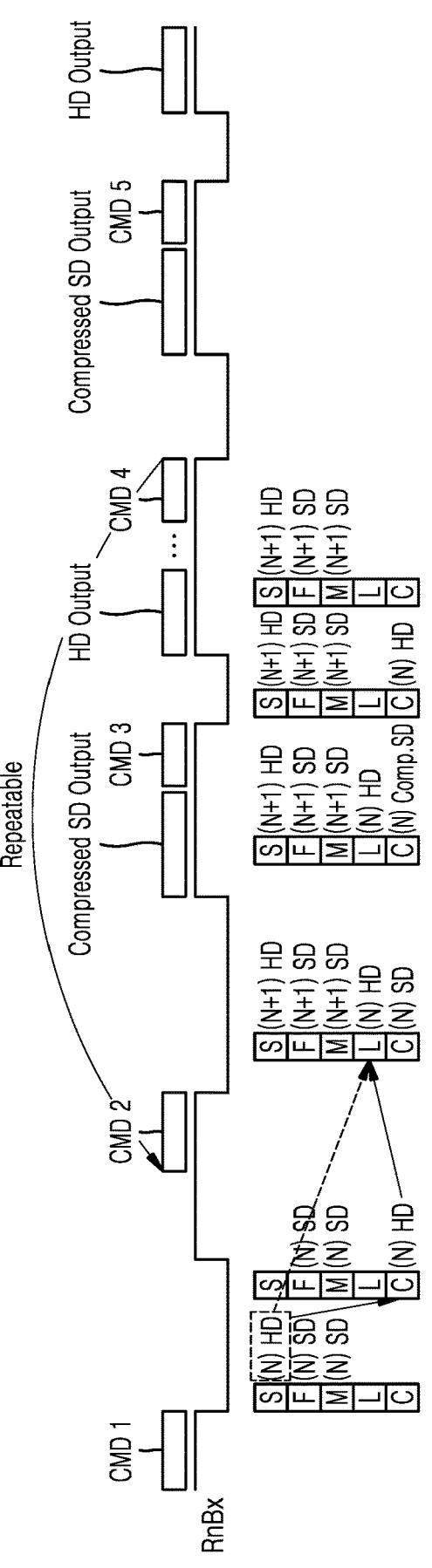

FIGS. 9 to 11 are diagrams illustrating examples of a dump operation according to some embodiments.

Referring to FIG. 9, a combination of a series of commands may be defined in relation to reading of one or more read units (e.g., pages), and the memory device according to an embodiment of the inventive concept may sequentially output the hard decision data HD and the soft decision data SD by executing the series of commands. In the configuration shown in FIG. 9, IOx denotes information communicated between a memory controller and the memory device, RnBx denotes an external ready/busy signal, and RnBi denotes an internal ready/busy signal.

As an example, when a first command CMD 1 is received, the internal ready/busy signal RnBi and the external ready/busy signal RnBx may transition to a logic low, a read operation may be performed on a first page for a certain period, and in the read operation, the first hard decision data HD and the first soft decision data SD may be generated together. The first hard decision data HD and the first soft decision data SD may be stored in a page buffer. The first hard decision data HD may then be dumped to a cache latch C during a period in which the external ready/busy signal RnBx is logic high, and the first hard decision data HD may be first provided to the memory controller.

In addition, the memory device may receive a second command CMD 2 during a period in which the internal ready/busy signal RnBi is logic high, and the first soft decision data SD may be dumped to the cache latch C. Furthermore, the memory device may perform the read operation on a second page in parallel with a compression operation being performed on the first soft decision data SD. Moreover, during a period in which the external ready/busy signal RnBx is logic high, the compressed first soft decision data SD may be output to the memory controller.

Thereafter, the memory device may dump the second hard decision data HD to the cache latch C in response to the reception of a third command CMD 3 and then output the dumped second hard decision data HD to the memory controller. Thereafter, the memory device may output the second soft decision data SD in response to the reception of a fourth command CMD 4. As an example, in response to the fourth command CMD 4, the memory device may dump the second soft decision data SD to the cache latch C, compress the second soft decision data SD, and output to the compressed second soft decision data SD to the memory controller.

In the embodiment shown in FIG. 9, since only the read operation on the first and second pages are shown, a command (e.g., the second command CMD 2) instructing the read operation and the compression operation is provided only once, but the embodiments are not necessarily limited thereto. For example, when more than two pages are read, the second commands CMD 2 may be provided to the memory device at least twice or more than two times, and data of all pages may be read and then, the third command CMD 3 and the fourth command CMD 4 for finally outputting the hard decision data HD and the soft decision data SD may be provided to the memory device.

FIG. 10 illustrates an example of a dump operation when hard decision data is output first in an embodiment. In the following embodiments, read and output processes with respect to an N-th page and an N+1-th page are described.

Referring to FIG. 10, as the N-th page is read in response to the first command CMD 1, N-th hard decision data (N) HD may be stored in a first latch S, and N-th soft decision data (N) SD may be stored in second and third latches F and M. In an embodiment, the second latch F may be used for sensing soft decision data, and soft decision data finally determined by using different offset read levels with respect to any one memory cell may be stored the third latch M.

During a period in which the external ready/busy signal RnBx is logic low, the N-th hard decision data (N) HD may be dumped to the fifth latch C, and during a period in which the external ready/busy signal RnBx is logic high, the N-th hard decision data (N) HD may be output to the memory controller. In addition, as the second command CMD 2 related to reading of the N+1th page is received, the N-th hard decision data (N) HD may be dumped to the fourth latch L, and the N-th soft decision data (N) SD may be dumped to the fifth latch C. In addition, N+1th hard decision data (N+1) HD read from the N+1th page may be stored in the first latch S, and N+1th soft decision data (N+1) SD may be stored in the second and third latches F and M. In this case, the external ready/busy signal RnBx is logic low. Additionally, during a read operation on the N+1th page, a compression operation may be performed on the N-th soft decision data (N) SD stored in the fifth latch C, and the compressed N-th soft decision data (N) SD may be output to the memory controller during a period in which the external ready/busy signal RnBx is logic high.

Thereafter, the N+1th hard decision data (N+1) HD may be dumped to the fifth latch C in response to the third command CMD 3, and may be output to the memory controller. In addition, thereafter, N+1th soft decision data (N+1) SD may be dumped to the fifth latch C based on a dump of at least one of the second and third latches F and M in response to the fourth command CMD 4. Further, the compression operation may be performed on the N+1th soft decision data (N+1) SD, and the compressed N+1 soft decision data (N+1) SD may be output to the memory controller.

In the embodiment shown in FIG. 10, the N-th hard decision data (N) HD is output to the memory controller and then remains in the fourth latch L, but the embodiments are not necessarily limited thereto. For example, as indicated by a dashed rectangle in FIG. 10 surrounding the fourth latch L, the N-th hard decision data (N) HD may be removed from the page buffer after being output to the memory controller. In other words, in the same manner as in the embodiment in which the soft decision data is output first described below, the N-th hard decision data (N) HD may remain in the page buffer during a read process with respect to the N+1th page, or, differently from the embodiment below, the N-th hard decision data (N) HD may be deleted during the read process with respect to the N+1th page.

FIG. 11 illustrates an example of a dump operation when soft decision data is output first in an embodiment.

Referring to FIG. 11, as the N-th page is read in response to the first command CMD 1 in the same or similar manner to the example of FIG. 10, the N-th hard decision data (N) HD may be stored in the first latch S, and the N-th soft decision data (N) SD may be stored in the second and third latches F and M. In addition, through dump processes, the N-th hard decision data (N) HD may be dumped to the fifth latch C, and thereafter, in response to the second command CMD 2, the N-th hard decision data (N) HD may be dumped to the fourth latch L, and the N-th soft decision data (N) SD may be dumped to the fifth latch C. In an embodiment, FIG. 11 illustrates that the N-th hard decision data (N) HD is dumped to the fifth latch C and then dumped to the fourth latch L as in the embodiment of FIG. 10, but the embodiment is not necessarily limited thereto. For example, as shown by a dashed arrow in FIG. 11, when soft decision data is output first, the N th hard decision data (N) HD may be directly dumped from the first latch S to the fourth latch L.

Thereafter, the N+1th hard decision data (N+1) HD read from the N+1th page may be stored in the first latch S, and the N+1th soft decision data (N+1) SD may be stored in the second and third latches F and M. In addition, the compression operation on the N-th soft decision data (N) SD may be performed in parallel with the read operation on the N+1th page, and the compressed N-th soft decision data (N) SD may be output to the memory controller during a period in which the external ready/busy signal RnBx is logic high.

Further, according to some embodiments, while the read operation of the N+1th page is performed, the N-th hard decision data (N) HD may remain in the fourth latch L, and in response to the third command CMD 3, the N-th hard decision data (N) HD may be dumped to the fifth latch C. In addition, the N-th hard decision data (N) HD may be output from the fifth latch C to the memory controller. Similar to the above operation, the dump operation may be performed on the N+1 th soft decision data (N+1) SD and the N+1 th hard decision data (N+1) HD are generated in response to the subsequent fourth and fifth commands CMD 4 and CMD 5, the N+1th soft decision data (N+1) SD may be output, and then, the N+1th hard decision data (N+1) HD may be output.

According to the embodiment shown in FIG. 11, unlike the embodiment shown in FIG. 10, the soft decision data may be output earlier than the hard decision data by controlling the dump operation in the page buffer. In other words, the memory controller may employ various algorithms in relation to data read and/or error correction, and processing characteristics of the data may differ depending on algorithms. According to some embodiments, an output order of the hard decision data and the soft decision data may be adaptively changed based on internal settings of the memory device, a setting control from the memory controller, or the command decoding result from the memory controller, and thus, communication with different types of memory controllers is possible, and the implementation cost of the memory device may be reduced.

Furthermore, in the embodiments shown in FIGS. 10 and 11, only four or five commands are shown since only the read operation on the N-th and N+1th pages is described, but as shown in FIGS. 10 and 11, when more pages are read, as at least some of the operations shown in FIGS. 10 and 11 are repeatedly performed, hard decision data and soft decision data of additional pages may be further output.

Figure 12:
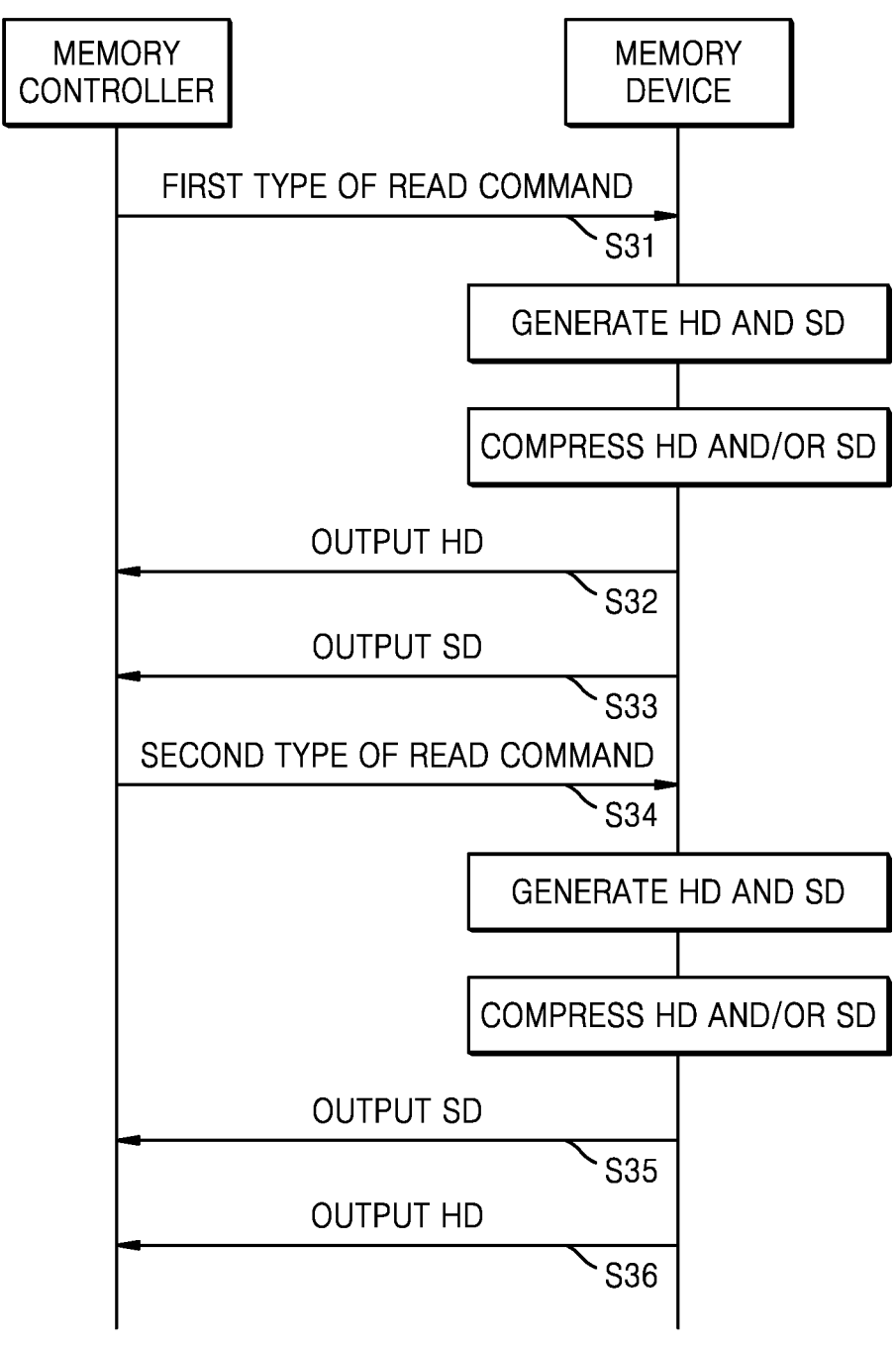
FIGS. 12 and 13 are diagrams illustrating an operation example of a memory system according to some embodiments.
Figure 13:
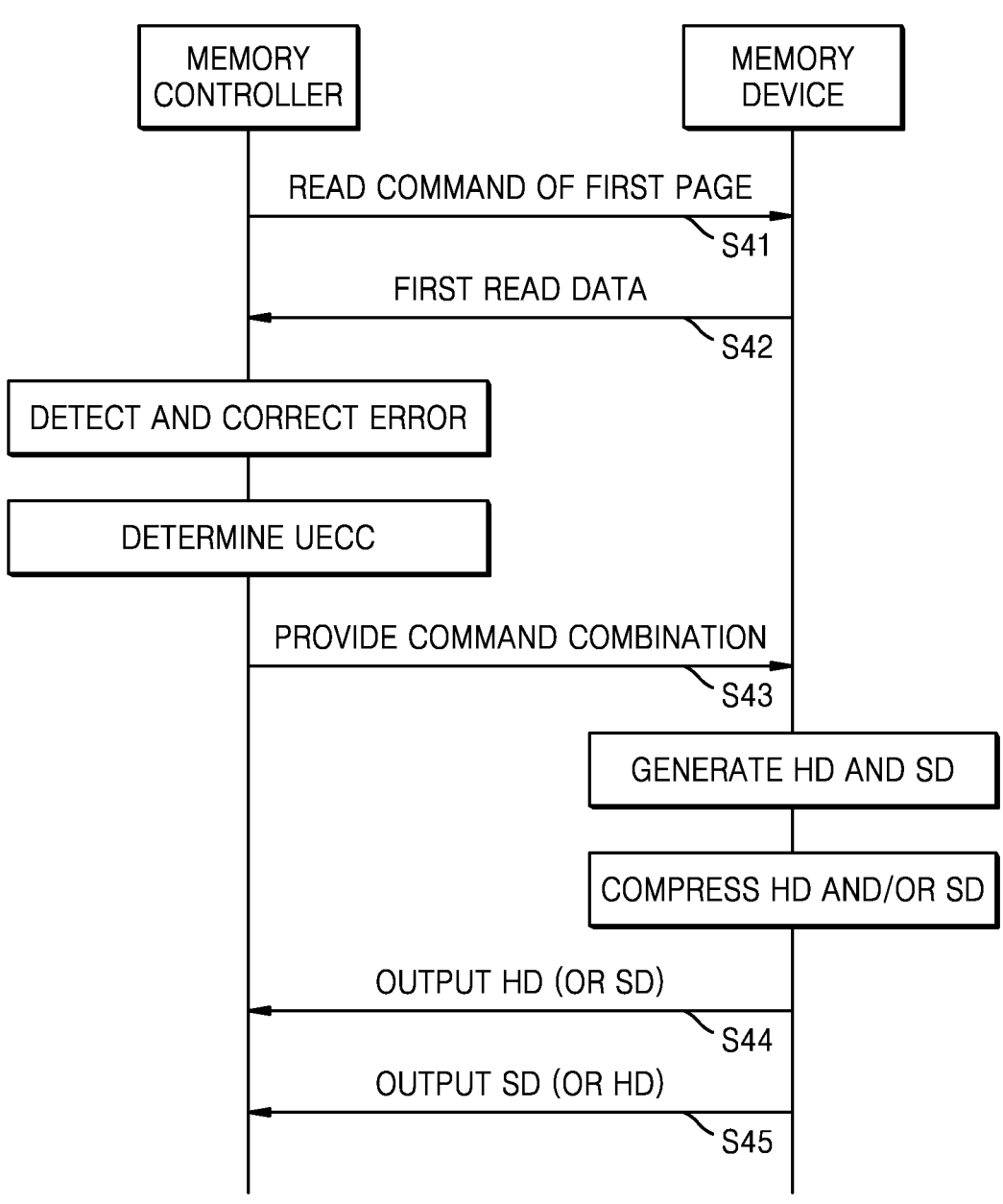

FIGS. 12 and 13 are diagrams illustrating an operation example of a memory system according to some embodiments.

Referring to FIG. 12, a memory controller may provide a first type of read command to a memory device (S31), and according to the above-described embodiments, the first type of read command may include a first command combination including a plurality of commands which are serially output. The memory device may generate the hard decision data HD and the soft decision data SD in response to the first type of read command, and may compress the hard decision data HD and/or the soft decision data SD. In response to the first type of read command, the memory device may first output the hard decision data HD (S32), and then output the soft decision data SD (S33). In the above description, various operations are serially performed in the memory device after the first type of read command is received, but various operations may be performed in the memory device in response to the commands included in the first type of read command.

The memory controller may then provide a second type of read command to the memory device (S34), and the memory device may generate the hard decision data HD and the soft decision data SD, and may compress the hard decision data HD and/or the soft decision data SD. Depending on the second type of read command, the memory device may first output the soft decision data SD (S35) and then output the hard decision data SD (S36).

According to the above embodiment, a data output order may be changed in real time during runtime of the memory device. For example, the first command combination and a second command combination may be defined as a plurality of command combinations in relation to the data output order, and the data output order may be changed according to a type of command combination provided from the memory controller.

Referring to FIG. 13, the memory controller may provide a read command with respect to a first page to the memory device (S41). The memory device may output first read data determined based on a normal read level to the memory controller in response to the read command (S42). The memory controller may perform an error detection and correction operation on the first read data, and when an error of the first read data is not corrected, may determine that an uncorrectable error UECC has occurred.

The memory controller may provide a command combination according to some embodiments to the memory device (S43). According to the above-described embodiments, the command combination may include a plurality of commands, and the memory device may control operations of generating, compressing, and dumping the hard decision data HD and the soft decision data SD according to a set operating environment. In addition, the memory device may first output any one of the hard decision data HD and the soft decision data SD according to the set operating environment. As an example, after the hard decision data HD is output first (S44), the soft decision data SD may be output (S45) and vice versa.

Figure 14:
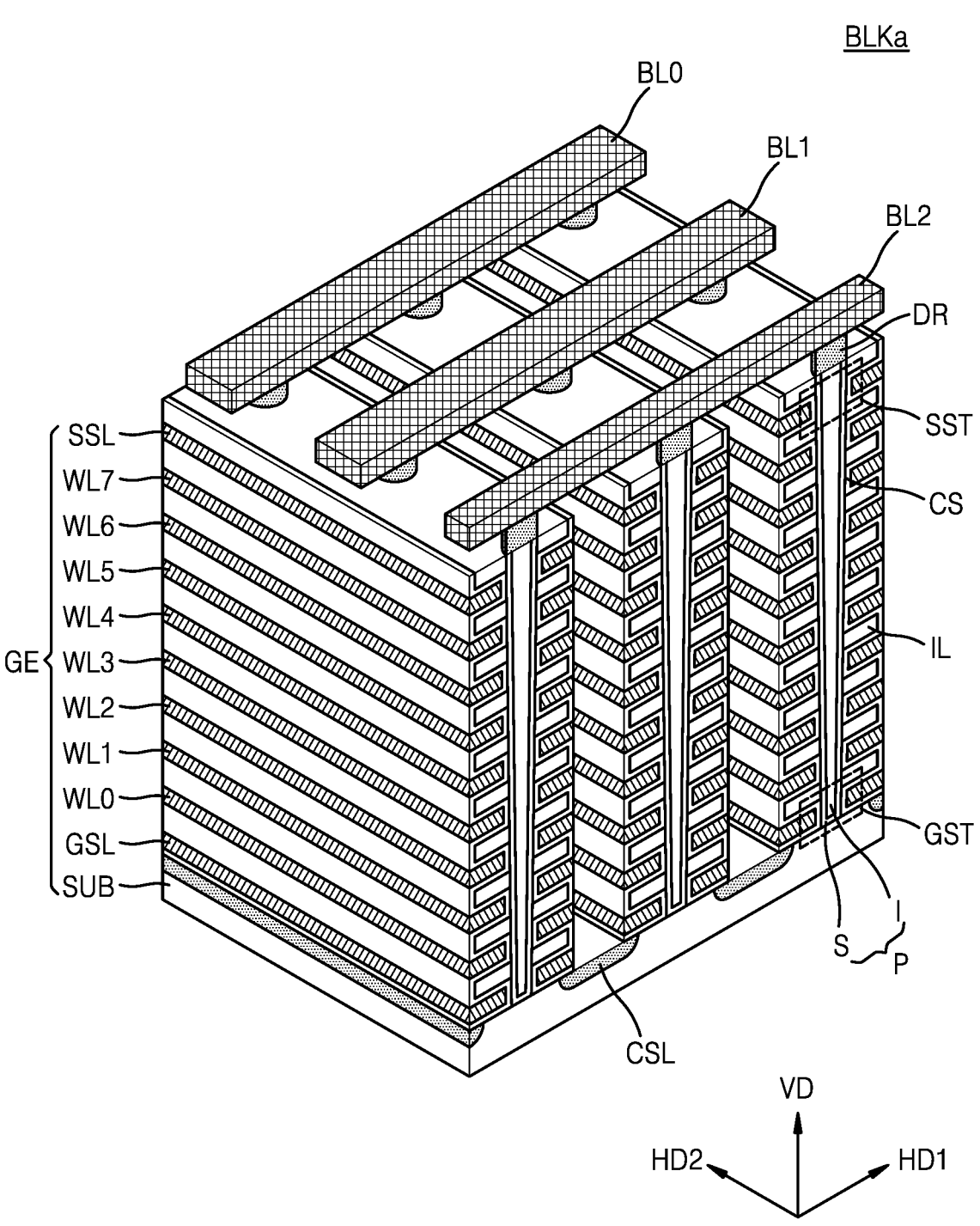
FIG. 14 is a perspective view illustrating a cell block included in a memory cell array of FIG. 6 according to an embodiment.

FIG. 14 is a perspective view illustrating a cell block BLKa included in the memory cell array 210 of FIG. 6 according to an embodiment. The cell block BLKa may include a plurality of pages. According to some embodiments, hard decision data and soft decision data may be generated from each page, and the hard decision data or the soft decision data may be controlled to be output first according to an operating environment of a memory device.

Referring to FIG. 14, the memory block BLKa is formed in a direction perpendicular to a substrate SUB. The substrate SUB has a first conductivity type (e.g., p-type), the memory block BLKa extends on the substrate SUB in a second horizontal direction HD2, and common source line CSL doped with impurities of a second conductivity type (e.g., n-type) is provided. On a region of the substrate SUB between two adjacent common source lines CSL, a plurality of insulating layers IL extending in the second horizontal direction HD2 are sequentially provided in a vertical direction VD, and are spaced apart from each other by a specific distance in the vertical direction VD. For example, the plurality of insulating layers IL may include an insulating material such as silicon oxide.

On the region of the substrate SUB between the two adjacent common source lines CSL, a plurality of pillars P sequentially disposed in a first horizontal direction HD1 and penetrating the plurality of insulating layers IL in the vertical direction VD are provided. For example, the plurality of pillars P may penetrate the plurality of insulating layers IL and contact the substrate SUB. For example, a surface layer S of each pillar P may include a silicon material of first type and may function as a channel region. An inner layer I of each pillar P may include an insulating material such as silicon oxide or an air gap.

In the region between the two adjacent common source lines CSL, a charge storage layer CS is provided along the insulating layers IL, the pillars P, and an exposed surface of the substrate SUB. The charge storage layer CS may include a gate insulating layer (also referred to as 'tunneling insulating layer'), a charge trap layer, and a blocking insulating layer. For example, the charge storage layer CS may have an oxide-nitride-oxide (ONO) structure. In addition, in the region between the two adjacent common source lines CSL, a gate electrode GE that includes gate selection lines GSL, string selection lines SSL and word lines WL0, WL1, WL3, WL4, WL5, WL6 and WL7 is provided on an exposed surface of the charge storage layer CS.

Drains or drain contacts DR are respectively provided on the plurality of pillars P. For example, the drains or drain contacts DR each may include a silicon material doped with impurities of a second conductivity type. Bit lines BL1, BL2 and BL3 extending in the first horizontal direction HD1 and spaced apart from each other by a specific distance in the second horizontal direction HD2 are provided on the drains DR. A string selection transistor SST may be formed in the region denoted by the dashed rectangle in FIG. 14.

Figure 15:
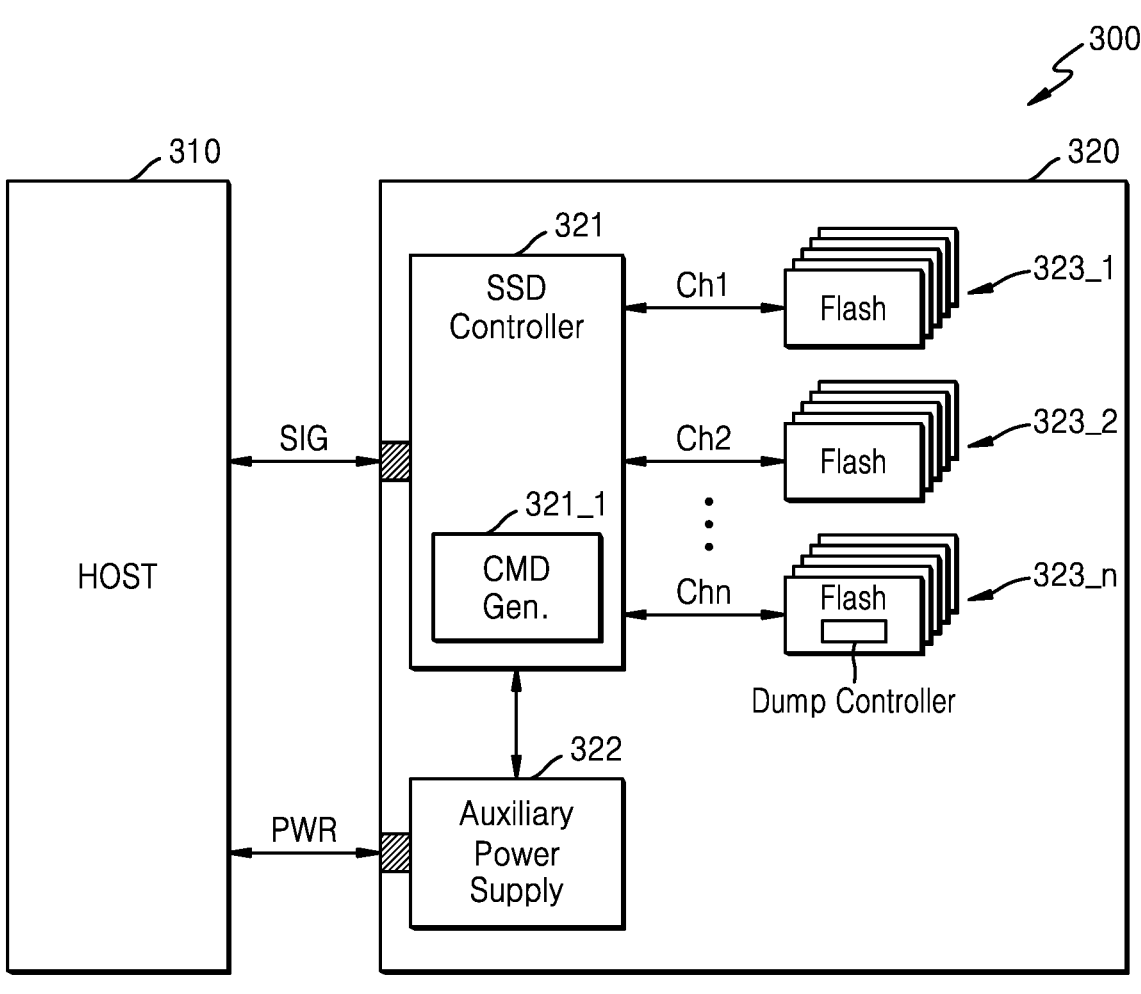
FIG. 15 is a block diagram illustrating an example of applying a memory device to a solid state drive (SSD) system according to some embodiments.

FIG. 15 is a block diagram illustrating an example of applying a memory device to an SSD system according to some embodiments.

Referring to FIG. 15, an SSD system 300 may include a host 310 and an SSD 320. The SSD 320 may exchange signals SIG with the host 310 through a signal connector and receive power PWR through a power connector. The SSD 320 may include an SSD controller 321, an auxiliary power supply 322, and memory devices 323_1, 323_2 . . . 323_n. The memory devices 323_1 to 323_n may be vertically stacked NAND flash memory devices. In this regard, the SSD 320 may be implemented using the embodiments described above with reference to FIGS. 1 to 14. In other words, the SSD controller 321 included in the SSD 320 may include a command generator 321_1 and may output a series of commands for outputting hard decision data and soft decision data according to the above-described embodiments. In addition, each of the memory devices 323_1 to 323_n may include a plurality of pages and a page buffer circuit, and may control a dump operation on a plurality of latches included in a page buffer. In this case, each of the memory devices 323_1 to 323_n may include a dump controller. Also, according to the embodiments shown in FIGS. 1 to 14, each of the memory devices 323_1 to 323_n may set an operating environment in relation to an output mode, and may first output the hard decision data or the soft decision data according to according to the operating environment.

While the inventive concept has been particularly shown and described with reference to embodiments thereof, it will be understood that various changes in form and detail may be made thereto without departing from the spirit and scope of the inventive concept as set forth in the following claims.

What is claimed is:

1. A memory device comprising:
a memory cell array comprising a plurality of pages each page comprising a plurality of memory cells;
a page buffer circuit comprising page buffers respectively corresponding to the plurality of memory cells of each page, each of the page buffers comprising first through N-th latches (where N is an integer greater than or equal to 2); and
a control logic configured to
control first hard decision data and first soft decision data read in a first read operation on a first page among the plurality of pages to remain in a first page buffer of the page buffers during a second read operation on a second page among the plurality of pages, and
set an output mode of the memory device to a first output mode or a second output mode, in the second output mode the first hard decision data is output first, and the setting of the first and second output modes is based on setting information stored in the memory device or a decoding result of a command received from a memory controller, and
control an output operation such that the first hard decision data is output after the first soft decision data is output when the memory device is set to the first output mode,
wherein the first hard decision data is based on a normal read level and the first soft decision data is based on an offset read level read from the first page.

2. The memory device of claim 1, wherein the first hard decision data and the first soft decision data are generated through different sensing timings in a same sensing period.

3. The memory device of claim 1, further comprising: a compression controller configured to perform compression on the first soft decision data in parallel with the second read operation.

4. The memory device of claim 1, wherein
when the first hard decision data is set to be output first as the memory device is set to the second output mode,
the first hard decision data is output to the memory controller before the second read operation is performed, and
the first soft decision data is output to the memory controller after the second read operation starts.

5. The memory device of claim 1, wherein,
when the memory device is set to the first output mode,
the first soft decision data is output to the memory controller after the second read operation starts, and
the first hard decision data is output to the memory controller in response to a command received after the first soft decision data is output.

6. The memory device of claim 1, wherein
the first to N-th latches include first, second, third, fourth and fifth latches, and during the first read operation, the first hard decision data is stored in the first latch, and the first soft decision data is stored in the second latch and the third latch.

7. The memory device of claim 6, wherein,
when the memory device is set to the first output mode, the first hard decision data is dumped to the fourth latch and remains in the fourth latch during the second read operation.

8. The memory device of claim 7, wherein
the first soft decision data is dumped to the fifth latch based on a value of at least one of the second latch or the third latch, and
the first soft decision data is output from the fifth latch to the memory controller.

9. The memory device of claim 8, wherein,
after the first soft decision data is output, the first hard decision data is dumped to the fifth latch, and
the first hard decision data is output from the fifth latch to the memory controller.

10. The memory device of claim 1, wherein
a command to control a read operation that is received from the memory controller includes first, second and third commands, and
as the memory device is set to the first output mode,
the first hard decision data and the first soft decision data are generated together in response to the first command, the first soft decision data is compressed and output in response to the second command, and the first hard decision data is output in response to the third command.

11. An operating method of a memory device comprising a memory cell array comprising a plurality of pages and a page buffer circuit comprising a plurality of page buffers, the operating method comprising:
reading first hard decision data and first soft decision data by performing a first read operation on a first page of the plurality of pages in response to a first command received from a memory controller;
storing the first hard decision data in a first latch in a page buffer of the plurality of page buffers;
storing the first soft decision data in a second latch and a third latch in the page buffer;
dumping the first hard decision data to a fourth latch in the page buffer;
dumping the first soft decision data to a fifth latch in the page buffer; and
reading second hard decision data and second soft decision data by performing a second read operation on a second page in response to a second command from the memory controller,
wherein the first hard decision data remains in the fourth latch while the second read operation is performed.

12. The operating method of claim 11, wherein
the first hard decision data is determined based on a normal read level, and the first soft decision data is determined based on at least one offset read level having an offset compared to the normal read level.

13. The operating method of claim 11, further comprising:
compressing the first hard decision data or the first soft decision data while the second read operation is performed.

14. The operating method of claim 11, further comprising:
in a mode where hard decision data is output first, dumping the first hard decision data to the fifth latch before dumping the first hard decision data to the fourth latch,
wherein the first hard decision data is output to the memory controller before the second command is received.

15. The operating method of claim 11, further comprising:
in a mode where soft decision data is output first,
dumping the first hard decision data to the fifth latch in response to a third command from the memory controller after outputting the first soft decision data stored in the fifth latch to the memory controller.

16. The operating method of claim 15, further comprising:
outputting the first hard decision data stored in the fifth latch to the memory controller;
outputting the second soft decision data to the memory controller in response to a fourth command from the memory controller; and
outputting the second hard decision data to the memory controller in response to a fifth command from the memory controller.

17. An operating method of a memory device comprising a memory cell array comprising a plurality of pages and a page buffer circuit comprising a plurality of page buffers, the operating method comprising:
setting an output mode to a first mode in response to a first command;
storing first hard decision data and first soft decision data read from a first page of the plurality of pages in latches in a page buffer of the plurality of page buffers;
dumping the first hard decision data to a cache latch in the page buffer and outputting the dumped first hard decision data;
dumping the first soft decision data to the cache latch and outputting the dumped first soft decision data after outputting the dumped first hard decision data;
setting the output mode to a second mode in response to a second command;
storing second hard decision data and second soft decision data read from a second page in the latches in the page buffer;
dumping the second soft decision data to the cache latch and outputting the dumped second soft decision data; and
dumping the second hard decision data to the cache latch and outputting the dumped second hard decision data after outputting the dumped second soft decision data.

18. The operating method of claim 17, wherein
the first command is provided from a first memory controller, and the first hard decision data and the first soft decision data are sequentially provided to the first memory controller, and
the second command is provided from a second memory controller different from the first memory controller, and the second soft decision data and the second hard decision data are sequentially provided to the second memory controller.

* * * * *